(12) United States Patent
Cui et al.

(10) Patent No.: US 12,112,939 B2
(45) Date of Patent: Oct. 8, 2024

(54) CLEANING PROCESS AND SEMICONDUCTOR PROCESSING METHOD

(71) Applicant: CHANGXIN MEMORY TECHNOLOGIES, INC., Hefei (CN)

(72) Inventors: Zhaopei Cui, Hefei (CN); Bingyu Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 471 days.

(21) Appl. No.: 17/489,996

(22) Filed: Sep. 30, 2021

(65) Prior Publication Data

US 2022/0246425 A1 Aug. 4, 2022

Related U.S. Application Data

(63) Continuation of application No. PCT/CN2021/103645, filed on Jun. 30, 2021.

(30) Foreign Application Priority Data

Feb. 3, 2021 (CN) .......................... 202110147705.6

(51) Int. Cl.
*H01L 21/02* (2006.01)
*B08B 7/00* (2006.01)
*H01L 21/265* (2006.01)

(52) U.S. Cl.
CPC .......... *H01L 21/02057* (2013.01); *B08B 7/00* (2013.01); *H01L 21/26513* (2013.01)

(58) Field of Classification Search
None
See application file for complete search history.

(56) References Cited

U.S. PATENT DOCUMENTS

| | | | |
|---|---|---|---|
| 9,589,785 B2 | 3/2017 | Cheng et al. | |
| 10,347,642 B2 | 7/2019 | Chang et al. | |
| 2004/0157385 A1* | 8/2004 | Ikezawa | H01L 21/32137 438/666 |
| 2006/0154488 A1* | 7/2006 | Morioka | H01L 21/823842 257/E21.549 |
| 2016/0059272 A1 | 3/2016 | Cheng et al. | |
| 2018/0190659 A1 | 7/2018 | Chang et al. | |
| 2021/0375899 A1* | 12/2021 | Lin | H01L 29/0649 |

FOREIGN PATENT DOCUMENTS

| | | |
|---|---|---|
| CN | 100454496 C | 1/2009 |
| CN | 104733283 A | 6/2015 |
| CN | 108269762 A | 7/2018 |
| CN | 110911266 A | 3/2020 |
| CN | 111357081 A | 6/2020 |
| CN | 112951711 A | 6/2021 |

* cited by examiner

*Primary Examiner* — Hsien Ming Lee

(74) *Attorney, Agent, or Firm* — Syncoda LLC; Feng Ma

(57) ABSTRACT

A cleaning process for cleaning a surface of a semiconductor structure is provided, in which residue layer is formed on the surface of the semiconductor structure. The cleaning process includes providing a first reaction gas and a second reaction gas to the surface of the semiconductor structure, in which the first reaction gas reacts with the second reaction gas to remove the residue layer while forming a protection layer on the surface of the semiconductor structure.

13 Claims, 2 Drawing Sheets

CLEANING PROCESS AND SEMICONDUCTOR PROCESSING METHOD

CROSS-REFERENCE TO RELATED APPLICATIONS

The present application is a continuation application of International Application No. PCT/CN2021/103645, filed on Jun. 30, 2021, which claims priority of Chinese Patent Application No. 202110147705.6, filed on Feb. 3, 2021. International Application No. PCT/CN2021/103645 and Chinese Patent Application No. 202110147705.6 are hereby incorporated by reference in their entireties.

BACKGROUND

With the continuous reduction of the size of the semiconductor device, such as dynamic random access memory (DRAM), people's demand for the electrical property of a semiconductor device is increasingly raised. During the preparation of a semiconductor device, a polysilicon layer, which is of great importance for meeting the demand for the electrical property, cannot be destroyed, otherwise the electrical property of the semiconductor device is severely affected.

In the traditional technical solution, after doping polysilicon and before the next deposition process, the surface of polysilicon is cleaned by using nitrogen trifluoride gas and hydrogen under the plasma condition, so that the oxide layer (silicon dioxide impurity) of the polysilicon layer is removed. However, under the plasma condition, nitrogen trifluoride reacts with silicon atoms of the polysilicon layer to generate silicon fluoride gas, resulting in the loss of the polysilicon layer and affecting the electrical property of the semiconductor device.

SUMMARY

The present disclosure relates to the field of a semiconductor device and its manufacture, and in particular to a cleaning process and a semiconductor processing method.

According to some embodiments, a first aspect of the present disclosure provides a cleaning process for cleaning a surface of a semiconductor structure, on which a residue layer is formed. The cleaning process includes operations as follow.

A first reaction gas and a second reaction gas are provided to the surface of a semiconductor structure, in which the first reaction gas reacts with the second reaction gas to form the residue layer while forming a protection layer on the surface of the semiconductor structure.

According to some embodiments, a second aspect of the present disclosure provides a semiconductor processing method, including a step of cleaning a semiconductor structure using the cleaning process in the embodiment above.

BRIEF DESCRIPTION OF THE DRAWINGS

In order to illustrate the technical solutions of the embodiments of the present disclosure or the traditional technology more clearly, the following will briefly introduce the accompanying drawings required for describing the embodiments or the traditional technology. Apparently, the accompanying drawings in the following description show only some embodiments of the present disclosure, and those of ordinary skill in the art may still derive other drawings from these accompanying drawings without creative efforts.

DETAILED DESCRIPTION

Figure 1:
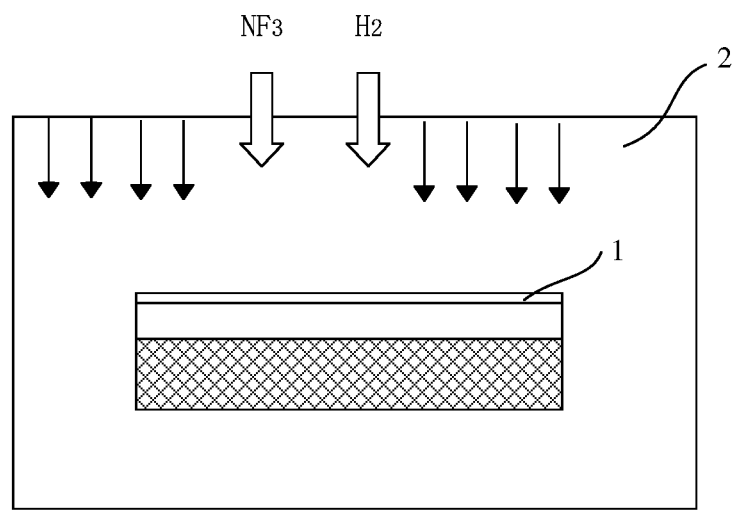
FIG. 1 is a schematic diagram of removing a residue layer on a surface of a semiconductor structure with a traditional cleaning process.

For convenience of understanding the present disclosure, the present disclosure will be described more comprehensive hereinafter with the drawings. The exemplary embodiments are given in the drawings. The present disclosure may, however, be embodied in many different forms which are not limited to the embodiments described herein. Rather, these embodiments are provided so that the contents of the present disclosure will be more thorough and complete.

Unless defined otherwise, all technical and scientific terms used herein have the same meaning as commonly understood by those skilled in the art to which the present disclosure belongs. The terms used herein in the specification of the present disclosure is for the purpose of describing specific embodiments only and is not intended to limit the present disclosure.

It should be understood that when an element or layer is referred to as "on", "adjacent to", "connected to" or "coupled to" another element or layer, it may be directly on the other element or layer, adjacent to the other element or layer, or connected to or coupled to the other element or layer, or there may be an intermediate element or layer. In contrast, when an element is referred to as "directly on", "directly adjacent to", "directly connected to" or "directly coupled to" another element or layer, there is no intermediate element or layer. It should be understood that although the terms, "first", "second", "third" and the like is used to describe various elements, components, regions, layers, doping types, and/or portions, these elements, components, regions, layers, doping types, and/or portions should not be limited by these terms. These terms are only used to distinguish one element, component, region, layer, doping type or portion from another element, component, region, layer, doping type or portion. Therefore, without departing from the instruction of the present disclosure, a first element, component, region, layer, doping type or portion discussed hereinafter may be expressed as a second element, component, region, layer, doping type or portion. For example, a first doping type may be referred to as a second doping type, and similarly, a second doping type may be referred to as a first doping type. The first doping type and the second doping type are of different doping types. For example, the first doping type may be a P type and the second doping type may be an N type, or the first doping type may be the N type and the second doping type may be the P type.

Spatial relationship terms such as "beneath", "below", "lower", "under", "above", or "upper" may be used herein to describe a relationship between one element or feature and another element or feature shown in the drawings. Understandably, in addition to the orientations shown in the drawings, the spatial relationship terms further include different orientations of device in use and operation. For example, if the device in the drawings is turned over, an element or feature described as being "below" or "under" or "beneath" another element will be oriented as being "above" the other element or feature. Therefore, the exemplary terms "below" and "under" may include up and down orientations. In addition, the device may also include additional orientations (e.g., rotation for 90 degrees or other orientations), and the spatial descriptors used herein are interpreted accordingly.

As used herein, the singular forms "a", "an", "one", and "the" may include the plural forms as well, unless the context clearly dictates otherwise. It should be further understood that when terms "composed of" and/or "comprise/include" are used in the specification, the presence of the stated features, integers, steps, operations, elements and/or components may be determined, but the existence or addition of one or more of other features, integers, steps, operations, elements, components and/or combinations is not excluded. Meanwhile, when used herein, the term "and/or" includes any of and all combinations of related listed items.

The embodiment of the present disclosure is described with reference to cross-sectional view of the schematic diagram of the ideal embodiment (and intermediate structure) of the present disclosure, such that changes in the shape shown due to, for example, manufacturing technology and/or tolerance can be expected. Therefore, the embodiment of the present disclosure should not be limited to specific shapes of the region shown herein, while shape deviation caused by manufacturing technology, for example, is included. For example, implementation regions shown as rectangles typically have rounded or curved features and/or injection concentration gradients at their edges rather than binary changes from injection regions to non-injection regions. Also, a buried region formed by injection may result in some injections in a region between the buried region and the surface through which the injection is performed. Therefore, the regions shown in the figure are illustrative substantially, their shape does not represent the actual shape of a region of the device, and does not limit the scope of the present disclosure.

In a semiconductor process, in order to obtain semiconductor devices with different electrical properties, usually, it is necessary to dope a polysilicon layer to change its electrical conductivity. Common doping processes include P-type doping and N-type doping. P-type doping is to dope the semiconductor structure with boron or aluminum so that a hole concentration in the semiconductor is greater than a free electron concentration; N-type doping is to dope the semiconductor structure with phosphorus, so that the free electron concentration in the semiconductor is greater than the hole concentration.

It should be noted that since silicon easily reacts with oxygen at normal temperature to generate silicon dioxide, a residue layer containing silicon dioxide particles is more likely to be formed on a surface of a doped polysilicon layer 1. Therefore, after doping and before depositing to a doped polysilicon layer 1, generally it is necessary to pre-clean the doped polysilicon layer 1, and one of the important purposes is to remove silicon dioxide impurity on the surface of a doped polysilicon layer 1.

As shown in FIG. 1, a traditional cleaning process includes: introducing nitrogen trifluoride and hydrogen into a process chamber 2 under a plasma condition, herein nitrogen trifluoride, hydrogen and silicon dioxide will react under the plasma condition to generate solid $(NH_4)_2SiF_6$. Solid $(NH_4)_2SiF_6$ is sublimated into gaseous $(NH_4)_2SiF_6$ at a temperature greater than 100° C., thereby removing the silicon dioxide impurity. The specific reaction equation is as follows:

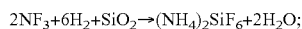
$2NF_3+6H_2+SiO_2 \rightarrow (NH_4)_2SiF_6+2H_2O;$

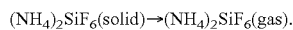
$(NH_4)_2SiF_6(\text{solid}) \rightarrow (NH_4)_2SiF_6(\text{gas}).$

Although the traditional cleaning process can achieve the purpose of removing the silicon dioxide impurity on the surface of a semiconductor structure, its side effects are also obvious: nitrogen trifluoride and hydrogen will also react with the doped polysilicon layer on the surface of a semiconductor structure under a plasma condition, and the specific reaction equation is as follows:

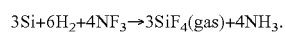
$3Si+6H_2+4NF_3 \rightarrow 3SiF_4(\text{gas})+4NH_3.$

It can be seen from the chemical reaction equation that under the plasma condition, nitrogen trifluoride, hydrogen and silicon chemically react to generate gaseous $SiF_4$ and ammonia gas, therefore the doped polysilicon layer 1 has a certain degree of loss (Poly lose). Therefore, the thickness of the doped polysilicon layer 1 is changed, thereby causing the decline or loss of the electrical property of the doped polysilicon layer 1, and as a result the expected electrical property and effect cannot be achieved.

Figure 2:
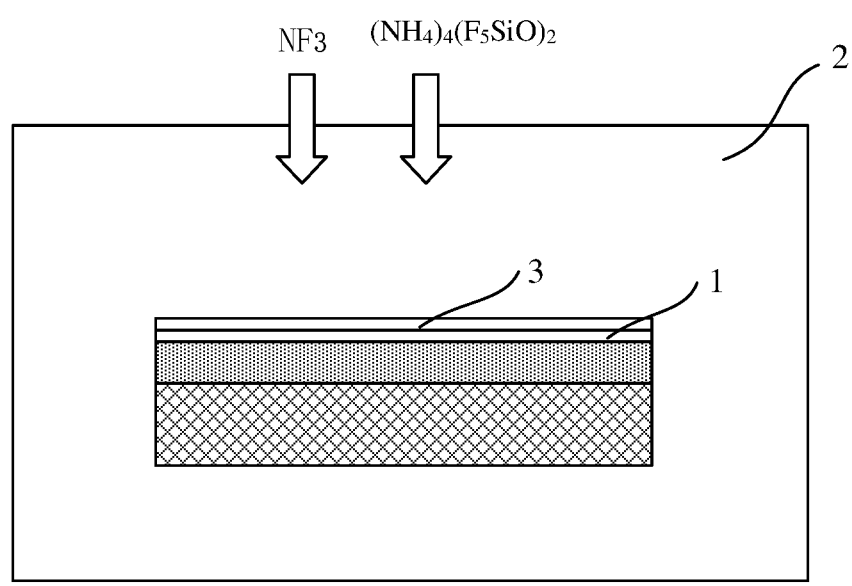
FIG. 2 is a schematic diagram of removing a residue layer on a surface of a semiconductor structure in one example of the present disclosure.

In order to solve the problem of Poly lose in the traditional cleaning process, one embodiment of the present disclosure provides a cleaning process. As shown in FIG. 2, a new cleaning process is utilized to clean a surface of a semiconductor structure with a residue layer formed thereon. The cleaning process includes: providing a first reaction gas and a second reaction gas to the surface of the semiconductor structure, in which the first reaction gas reacts with the second reaction gas to remove the residue layer while forming a protection layer 3 on the surface of the semiconductor structure. During a preparation process of the semiconductor device, external pollutants such as dust, grease, and the like may be adhered. This part of pollutants can be easily removed with simple physical methods. It should be noted that the surface of the semiconductor device may also chemically react with air or other chemical substances when a condition is met, thereby generating compound contaminants on the surface of the semiconductor device. Generally, compound contaminants cannot be removed by physical methods, and usually utilize complex chemical reactions. The two types of contaminants above both affect the electrical property of the semiconductor, therefore the cleaning process is important in a semiconductor preparation process. The cleaning process provided by the present disclosure is mainly applicable to a pre-cleaning step before a deposition process of the semiconductor structure.

In the present embodiment, during cleaning, the semiconductor structure to be cleaned may be placed in a sealed process chamber 2, then the first reaction gas and the second reaction gas are introduced for reaction. Specifically, the process chamber 2 may be a chamber for performing the cleaning process. The first reaction gas chemically reacts with the second reaction gas to generate a variety of chemical substances. A part of the chemical substances react with the residue layer on the surface of the semiconductor structure, and the residue layer is removed. The other part of the chemical substances are attached to the surface of the semiconductor structure to form the protection layer 3 which can prevent the surface of the semiconductor structure from being destroyed. The material of the protection layer 3 may be the same as that of the surface of the semiconductor structure.

In the cleaning process above, there is no need to perform cleaning under a plasma condition, the condition that the cleaning process needs to meet is lower and the cost is reduced. Also, the cleaning process in the present embodiment can remove the residue layer and form the protection layer 3 on the surface of the semiconductor structure on the surface of the semiconductor structure, further the surface of the semiconductor structure is prevented from being destroyed in the cleaning process and the electrical property of the semiconductor device is prevented from being affected.

In one embodiment, the semiconductor structure includes a doped polysilicon substrate, or the doped polysilicon layer 1 shown in FIG. 2, and the residue layer is located on the surface of the doped polysilicon substrate or the surface of the doped polysilicon layer 1. The residue layer on the surface includes oxide particles, such as silicon dioxide particles. This is because silicon may react with oxygen in the air to generate silicon dioxide at normal temperature.

In order to remove the silicon dioxide particles on the surface of the semiconductor structure, in the present embodiment, equal amounts of the first reaction gas and the second reaction gas are provided to the process chamber 2 to perform the cleaning process. The first reaction gas includes $NF_3$ (nitrogen trifluoride) gas, the second reaction gas includes $(NH_4)_4(F_5SiO)_2$ (ammonium fluosilicate peroxide) gas. The structural formula of $(NH_4)_4(F_5SiO)_2$ is as follows:

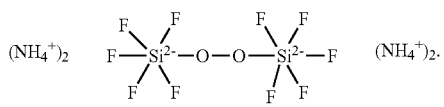

Since there is a peroxy bond in $(NH_4)_4(F_5SiO)_2$, and a covalent bond between an oxygen atom and an oxygen atom of the peroxy bond is unstable, a group that may form a covalent bonds with the oxygen atoms can be added between the peroxy bond. Optionally, alkylene can be added between the peroxide bond of $(NH_4)_4(F_5SiO)_2$ to form a compound composed of $(NH_4)_4(F_5SiO)_2$ and alkylene. The alkylene has a general formula of $-C_nH_{2n}-$, where n is an integer greater than or equal to 1. By adding alkylene between the peroxide bond of $(NH_4)_4(F_5SiO)_2$, different substances can be obtained with different value of n. Optionally, in addition to alkylene, other group that can form a covalent bond with the oxygen atom can also be bonded with the peroxy bond. Therefore, in the present disclosure, the substance that can be used as the second gas not only includes $(NH_4)_4(F_5SiO)_2$, but also includes a variety of derivatives based on $(NH_4)_4(F_5SiO)_2$.

As an example, X is $-(CH_2)_n-$, where n is an integer greater than or equal to 1, and the structural formula of the particular derivative of $(NH_4)_4(F_5SiO)_2$ is as follows:

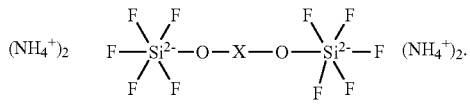

Compared with the traditional cleaning process, the cleaning process in the present embodiment may be performed without a plasma condition. However, the cleaning process in the present embodiment has a certain requirement for a reaction temperature. Specifically, the reaction temperature needs to be controlled at 300° C. to 400° C. This is because $NF_3$ is relatively inactive at normal temperature and normal pressure, showing very low reactivity and unable to react with $(NH_4)_4(F_5SiO)_2$ or a derivative thereof. When a temperature is higher than 300° C., $NF_3$ can be decomposed to release active fluorine that can react with most substances. When the temperature rises to 400° C. or above, the reactivity of $NF_3$ becomes more like fluorine, but uncontrollable homopolymers may be generated, a large amount of heat may be released. Therefore, a reaction temperature of the cleaning process in the present disclosure is controlled at 300° C. to 400° C., specifically, the reaction temperature may be 300° C., 350° C., 330° C., 370° C. or 400° C., etc.

Compared with the traditional cleaning process, the cleaning process in the present embodiment needs no more of plasma condition, and only needs to control the reaction temperature at 300° C. to 400° C. The condition that the cleaning process needs to meet is reduced, and the cost of the cleaning process is reduced. In one example, under the condition that the reaction temperature is controlled at 300° C. to 400° C., nitrogen trifluoride gas reacts with ammonium fluosilicate peroxide gas, and the chemical equation is as follows:

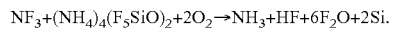

$NH_3$, HF and $F_2O$ are gaseous, and Si is solid polysilicon. The solid polysilicon will be adhered to the surface of the semiconductor structure, and the ammonia gas and hydrogen fluoride will further react with silicon dioxide, and the silicon dioxide particles on the surface of the semiconductor structure is removed. The specific reaction equation is as follows:

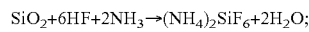

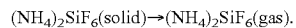

The ammonia gas, hydrogen fluoride and the silicon dioxide particles react to generate solid $(NH_4)_2SiF_6$. In the last chemical equation, solid $(NH_4)_2SiF_6$ is unstable and will be sublimated into gaseous $(NH_4)_2SiF_6$ when the temperature is higher than 100° C. Through a series of chemical reactions above, the silicon dioxide is removed from the doped polysilicon surface. At the same time, since the nitrogen trifluoride gas and the ammonium fluosilicate peroxide gas generate solid polysilicon during the reaction, the solid polysilicon will be attached to the doped polysilicon surface to form the protection layer 3, thereby protecting the doped polysilicon layer 1 from loss and other damages.

In the cleaning process in the present embodiment, the nitrogen trifluoride gas reacts with the ammonium fluosilicate peroxide gas. On one hand, the ammonia gas and hydrogen fluoride which may react with the silicon dioxide particles on the surface of the semiconductor structure are generated, so that the silicon dioxide particles are removed. On the other hand, in the chemical reaction, solid polysilicon may also be generated, the solid polysilicon may be attached to the surface of the semiconductor structure to form the protection layer 3, thus the original doped polysilicon layer 1 is protected and fundamentally the problem of Poly lose is solved.

Another aspect of the present disclosure provides a semiconductor processing method, including the step of cleaning a semiconductor structure using the cleaning process in any one of the embodiments above.

In one example, before cleaning the semiconductor structure using the cleaning process in any one of the embodiments above, the semiconductor processing method above further includes: performing ion implantation on a polysilicon substrate or a polysilicon layer to form the semiconductor structure. Ion implantation is an important doping process of the microelectronic process and is essential in the preparation of large-scale integrated circuits. By ion implantation on the polysilicon substrate or the polysilicon layer, the desired ions to be doped ions may be implanted into the polysilicon layer to obtain a doped polysilicon layer 1, and the electrical property of the semiconductor structure is changed. After ion implantation is completed, photoresist is usually left on the surface of a semiconductor structure. Also, as mentioned before, silicon will also react with oxygen in the air to generate silicon dioxide. Therefore, after ion implementation, a variety of cleaning processes are performed to remove various impurities from the surface of the semiconductor structure.

In one example, after cleaning the semiconductor structure using the cleaning process in any one of the embodiments above, the semiconductor processing method above further includes: a step of forming a deposition material layer on the surface of the semiconductor structure. Since silicon very easily reacts with oxygen under an aerobic condition, a residue layer (silicon dioxide) is formed on the surface of the semiconductor structure again. Therefore, the deposition material layer is formed on the surface of the semiconductor structure after cleaning, so that contact between silicon and oxygen is effectively blocked, the formation of a silicon dioxide layer again is prevented, it is ensured that the electrical property of the semiconductor is not affected In one example, the semiconductor processing method above is used for preparation of a memory device, including a flash memory (Flash) or a dynamic random access memory (DRAM). Optionally, the semiconductor process above may also be used for other semiconductor devices with a doped polysilicon layer 1. In the preparation process of such a semiconductor device, the residue layer (including silicon dioxide particles) needs to be removed from the surface of the doped polysilicon layer 1, and loss of the doped polysilicon layer 1 also needs to be avoided in the cleaning process.

The technical features of the embodiments above can be combined arbitrarily. In order to make the description concise, all possible combinations of various technical features in the embodiments above are not completely described. However, as long as there is no contradiction in the combination of these technical features, it should be regarded as the scope of this specification.

The foregoing embodiments represent only a few implementations of the present disclosure, and the descriptions are specific and detailed, but it should not be construed as limiting the patent scope of the present disclosure. It should be noted that those of ordinary skill in the art may further make variations and improvements without departing from the conception of the present disclosure, and these all fall within the protection scope of the present disclosure. Therefore, the patent protection scope of the present disclosure should be subject to the appended claims.

The invention claimed is:

1. A cleaning process, for cleaning a surface of a semiconductor structure, on which a residue layer is formed, wherein the cleaning process comprises:
providing a first reaction gas and a second reaction gas to the surface of the semiconductor structure, wherein the first reaction gas reacts with the second reaction gas to remove the residue layer while forming a protection layer on the surface of the semiconductor structure;
wherein the semiconductor structure comprises a doped polysilicon substrate or comprises a doped polysilicon layer, and the residue layer is located on a surface of the doped polysilicon substrate or a surface of the doped polysilicon layer; and wherein the residue layer comprises oxide particles, the first reaction gas reacts with the second reaction gas to generate ammonia gas and hydrogen fluoride, and the ammonia gas and hydrogen fluoride react with the residue layer to remove the residue layer.

2. The cleaning process of claim 1, wherein the first reaction gas comprises nitrogen trifluoride gas, the second reaction gas comprises a gas containing ammonium fluosilicate peroxide or a derivative formed of ammonium fluosilicate peroxide and an alkane, wherein a compound of the second reaction gas is represented by the general formula below:

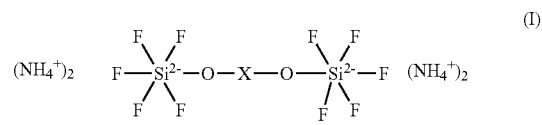

wherein X is $-(CH_2)_n-$, n is an integer greater than or equal to 1.

3. The cleaning process of claim 2, wherein the alkane is represented by $C_nH_{2n+2}$, wherein n is an integer greater than or equal to 1.

4. The cleaning process of claim 2, wherein a reaction temperature for the reaction of the first reaction gas and the second reaction gas is 300° C. to 400° C.

5. The cleaning process of claim 2, wherein a chemical reaction equation of the nitrogen trifluoride gas and the ammonium fluosilicate peroxide gas is:

$$SiO_2 + 6HF + 2NH_3 \rightarrow (NH_4)_2SiF_6 + 2H_2O;$$

wherein $NH_3$, HF and $F_2O$ are gaseous, and Si is solid polysilicon.

6. The cleaning process of claim 5, wherein the oxide particles comprise silicon dioxide particles; a reaction chemical formula of the ammonia gas, the hydrogen fluoride and the silicon dioxide particles is:

$$SiO_2 + 6HF + 2NH_3 \rightarrow (NH_4)_2SiF_6 + 2H_2O$$

$$(NH_4)_2SiF_6 \rightarrow (NH_4)_2SiF_6\uparrow$$

wherein $(NH_4)_2SiF_6$ generated by the reaction of the ammonia gas, hydrogen fluoride and the silicon dioxide particles is solid, and solid $(NH_4)_2SiF_6$ is sublimated into gaseous $(NH_4)_2SiF_6$.

7. The cleaning process of claim 1, wherein the first reaction gas reacts with the second reaction gas under a non-plasma condition.

8. A semiconductor processing method, comprising cleaning the semiconductor structure with the cleaning process of claim 1.

9. The semiconductor processing method of claim 8, further comprising performing ion implantation on a polysilicon substrate or a polysilicon layer to form the semiconductor structure before cleaning the semiconductor structure.

10. The semiconductor processing method of claim 9, further comprising forming a deposition material layer on the surface of the semiconductor structure after cleaning the semiconductor structure.

11. The semiconductor processing method of claim 8, wherein the semiconductor processing method is used for preparation of a memory device.

12. The semiconductor processing method of claim 11, wherein the memory device comprises a flash memory or a dynamic random access memory.

13. A cleaning process, for cleaning a surface of a semiconductor structure, on which a residue layer is formed, wherein the cleaning process comprises:
   providing a first reaction gas and a second reaction gas to the surface of the semiconductor structure, wherein the first reaction gas reacts with the second reaction gas to remove the residue layer while forming a protection layer on the surface of the semiconductor structure;
   wherein the protection layer comprises a polysilicon layer.

* * * * *